(12) United States Patent
Zhang et al.

(10) Patent No.: US 7,446,606 B2
(45) Date of Patent: Nov. 4, 2008

(54) METHODS AND APPARATUS TO PROVIDE SLEW ENHANCEMENT FOR LOW POWER AMPLIFIERS

(75) Inventors: Joy Yue Zhang, Tuscon, AZ (US); Rodney T. Burt, Tuscon, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 11/451,115

(22) Filed: Jun. 12, 2006

(65) Prior Publication Data

US 2007/0279129 A1    Dec. 6, 2007

Related U.S. Application Data

(60) Provisional application No. 60/809,504, filed on May 31, 2006.

(51) Int. Cl.
*H03F 3/45* (2006.01)

(52) U.S. Cl. .................. 330/253; 330/257; 330/311

(58) Field of Classification Search ............. 330/253, 330/311, 257
See application file for complete search history.

(56) References Cited

U.S. PATENT DOCUMENTS

| 3,859,557 | A  | * | 1/1975  | Grant et al. | 315/387 |
| 6,051,999 | A  | * | 4/2000  | To et al.    | 327/66  |
| 6,650,174 | B2 | * | 11/2003 | Bell         | 327/540 |
| 6,734,652 | B1 | * | 5/2004  | Smith        | 320/163 |
| 6,788,123 | B2 | * | 9/2004  | Roy          | 327/261 |
| 2006/0181350 | A1 | * | 8/2006 | Jones        | 330/255 |

* cited by examiner

*Primary Examiner*—Patricia Nguyen
(74) *Attorney, Agent, or Firm*—Warren L. Franz; Wade J. Brady, III; Frederick J. Telecky, Jr.

(57) ABSTRACT

Methods and apparatus to provide increased current to a cascode amplifier to maximize slew rate are disclosed. The amplifier has a first input coupled to an input switch and a load circuit for amplifying an input voltage on the first input. A slewing input voltage to the amplifier is detected. Current is increased to the load circuit to increase the slew rate of an output voltage.

18 Claims, 6 Drawing Sheets

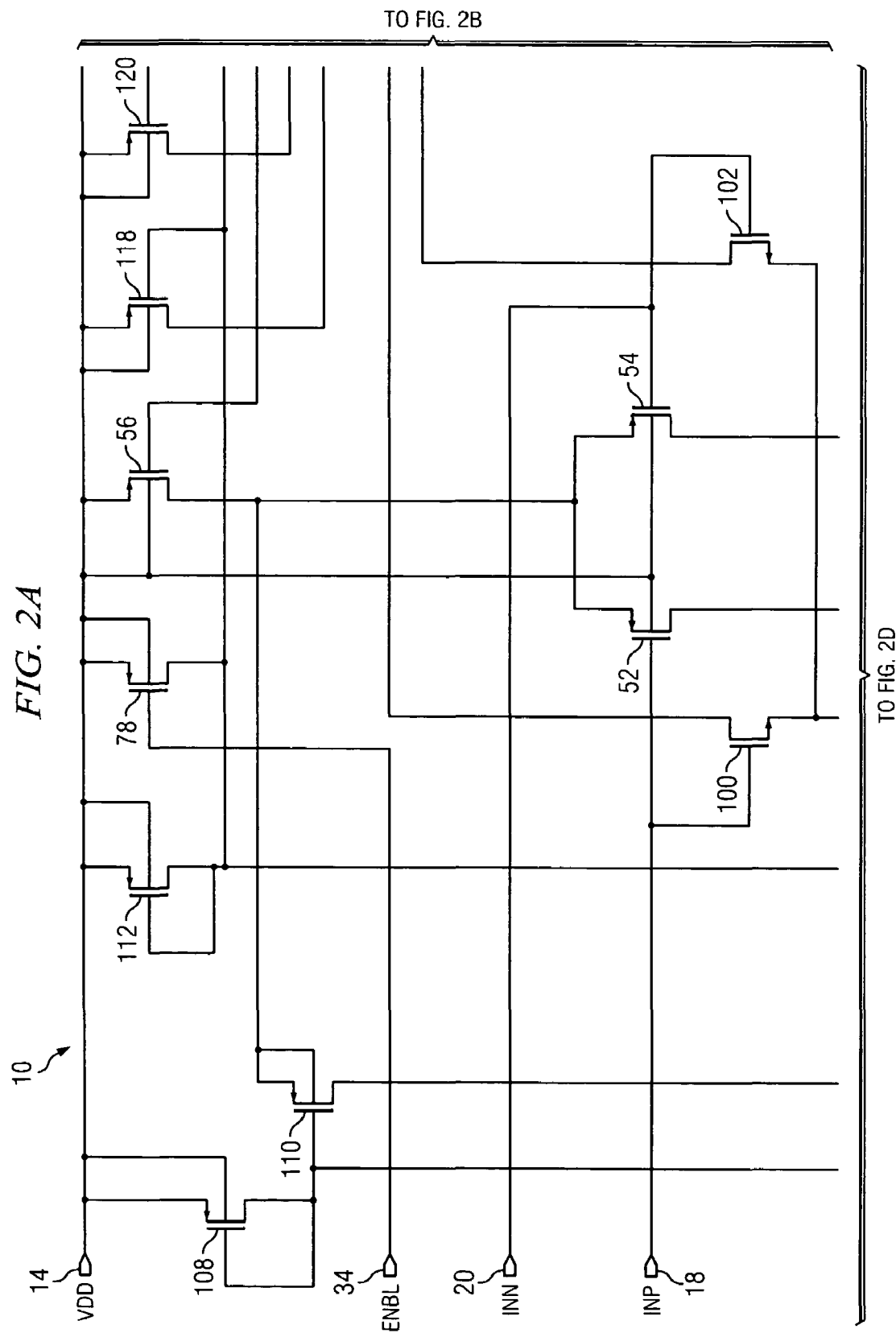

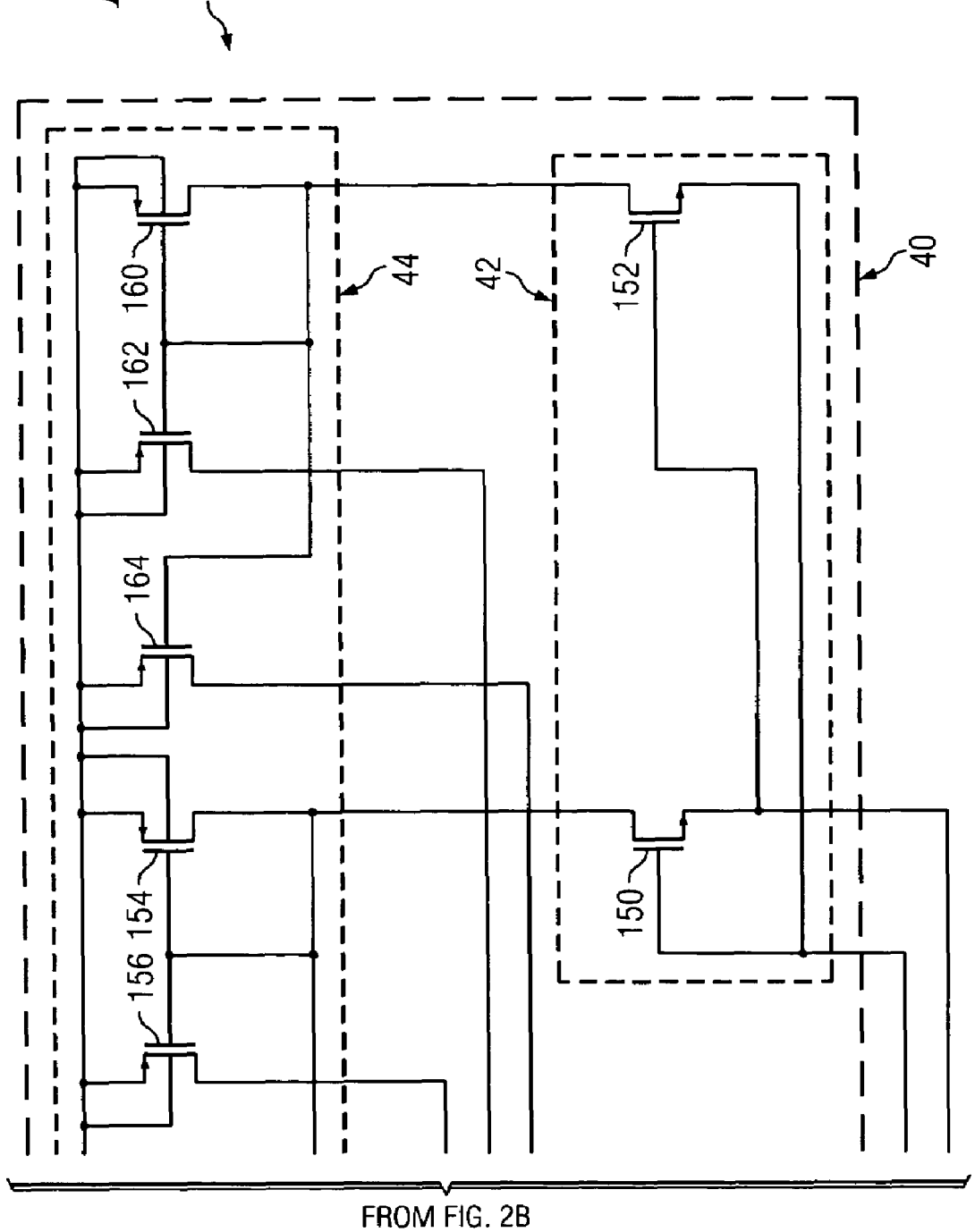

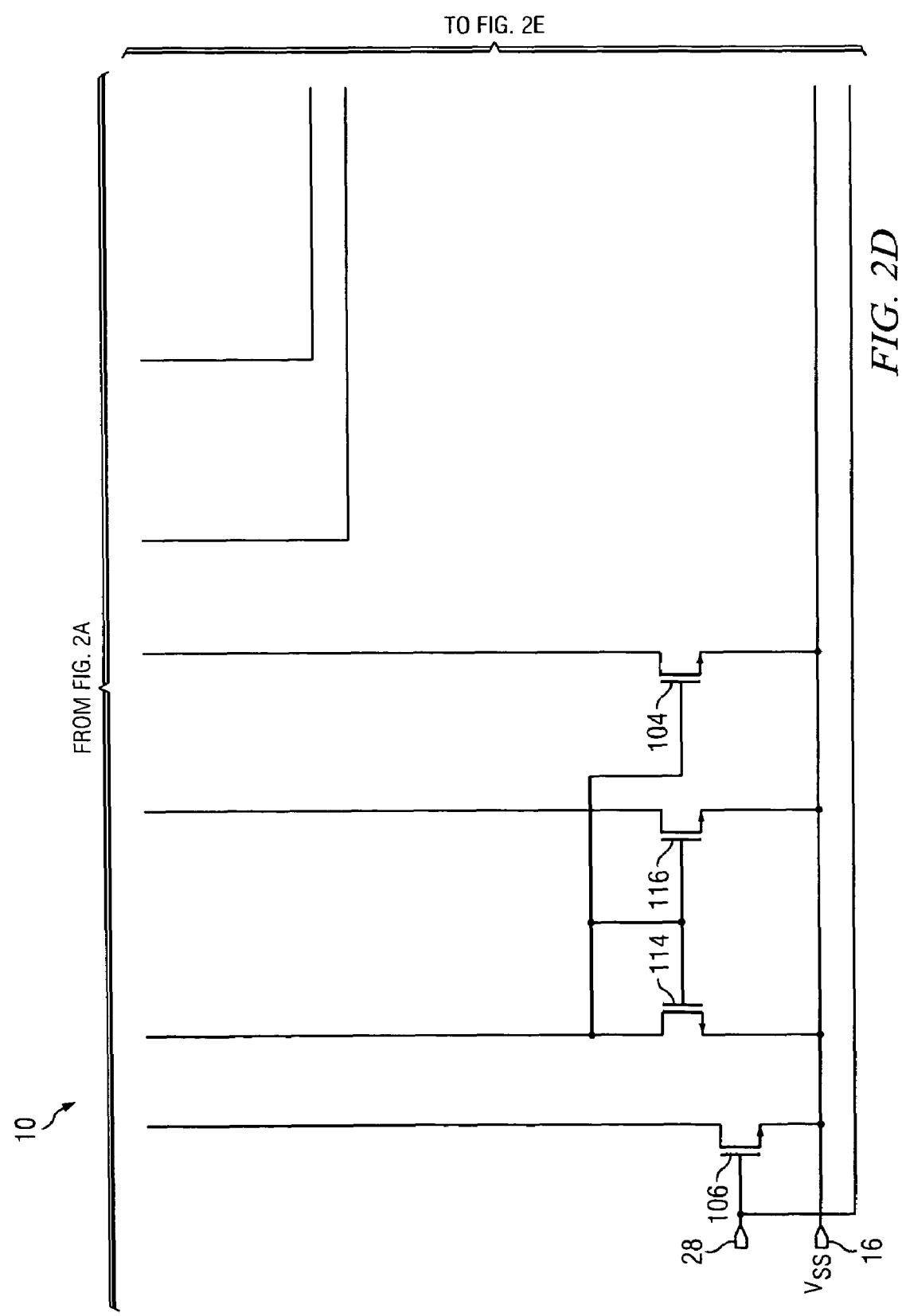

METHODS AND APPARATUS TO PROVIDE SLEW ENHANCEMENT FOR LOW POWER AMPLIFIERS

RELATED APPLICATIONS

This application claims benefit of Provisional Application No. U.S. 60/809,504 filed May 31, 2006 and hereby incorporates by reference all the contents of that application.

FIELD OF THE DISCLOSURE

This disclosure relates generally to amplifier devices and, more particularly, to methods and apparatus to provide slew enhancement for low power amplifiers.

BACKGROUND

Folded cascode amplifiers are typically used to obtain reasonable common mode and output range in low power supply voltage applications. A folded cascode amplifier is an arrangement of active electronic devices that combines an input stage and a folded cascode load stage to increase gain for increased output resistance and reduced parasitic capacitance, resulting in high gain with increased bandwidth. Quiescent current is the current that flows in the folded cascode amplifier stage during small signal amplifier operation. When there are relatively large voltage changes between the amplifier inputs (e.g., during large signal amplifier operation) there is a corresponding change in the amplifier output. The non-linear effect of these changes is termed slewing and the slew rate is the maximum rate of change of signal at an amplifier output. It is desirable to maximize the slew rate of the amplifier for many applications. The quiescent current of the folded cascode amplifier stage is typically slightly larger than the input pair tail current on the amplifier inputs to insure a good slew rate.

When the folded cascode amplifier is operated in small signal mode, which does not result in slewing, the larger quiescent current in the folded cascode stage wastes power. Moreover, a larger quiescent current in the folded cascode stage also provides higher noise. However, in order to maintain smooth slew transition, the quiescent current must be sufficiently high.

BRIEF DESCRIPTION OF THE DRAWINGS

FIGS. 2A-2E are a circuit diagram of one example of an amplifier with a folded cascode load circuit that detects slewing and supplies current to enhance slewing operation.

DETAILED DESCRIPTION

An example method and apparatus to provide slew enhancement for low power amplifiers is disclosed. An example method provides increased current to a cascode amplifier to increase stewing rate. The cascode amplifier has a first input coupled to an input switch and a first load circuit for amplifying a voltage on the first input. A slewing voltage input to the first input of the amplifier is detected. Current is increased to the first load circuit to increase the slew rate of an output voltage.

Another example cascode amplifier includes a power supply input and a low power supply input. A first load circuit is coupled between the low power supply input and the power supply input, the first load circuit includes a positive output. A second load circuit is coupled between the low power input and the power supply input, the second load circuit includes a negative output. A positive input is coupled to a first input switch which is coupled between the power supply input and the first load circuit. A negative input is coupled to a second input switch which is coupled between the power supply input and the second load circuit. A slew detector is coupled to the first and second input switch to detect a slewed voltage input on the positive or negative input. A current amplifier is coupled to the first load circuit. The current amplifier sends an amplified current to the first load circuit when a slewed voltage input is detected by the slew detector.

Figure 1:
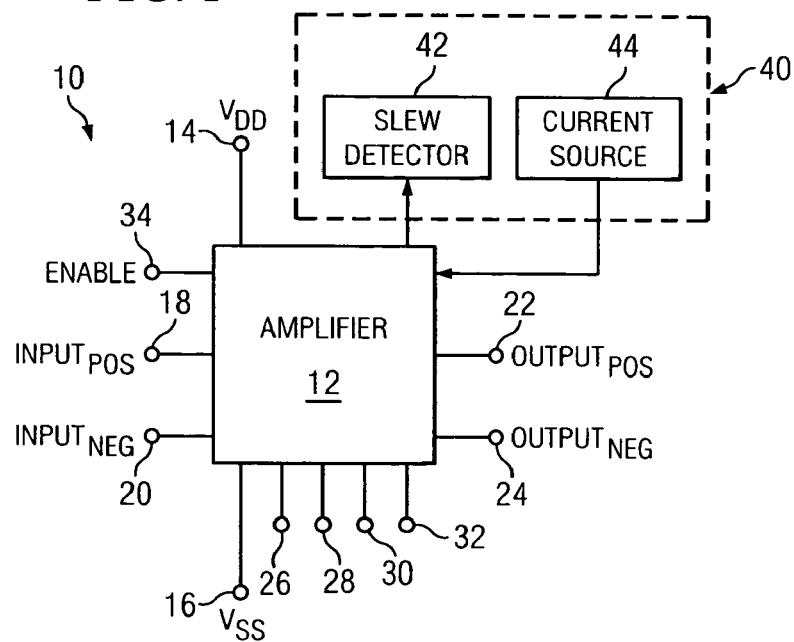
FIG. 1 is a block diagram of an amplifier assembly including an example slew enhancement circuit.

FIG. 1 is a block diagram of an amplifier assembly 10 including an example folded cascode amplifier 12. The folded cascode amplifier 12 has a high voltage or power supply input 14 and a low power supply input 16. The cascode amplifier 12 has a positive input 18, a negative input 20, a positive output 22 and a negative output 24. The cascode amplifier 12 also has a series of bias inputs 26, 28, 30 and 32 and an enable input 34.

The amplifier assembly 10 includes a slew enhancement circuit 40 which includes a slew detector circuit 42 and a current source 44. The slew detector circuit 42 detects a slewing input voltage between the positive input 18 and the negative input 20 of the cascode amplifier 12. The current source 44 provides extra current when the cascode amplifier 12 is negative or positive slewing.

FIGS. 2A-2E collectively are a circuit diagram of an example circuit which may be used for the amplifier assembly 10 in FIG. 1. In the example circuit in FIGS. 2A-2E, the positive input 18 and negative input 20 of the cascode amplifier 12 control input switches such as an input pair of P-type metal oxide semi-conductor field effect transistors (MOSFET) 52. In the example cascode amplifier 12, the positive input 18 is tied to the gate of the MOSFET 52 and the negative input 20 is tied to the gate of the MOSFET 54. The sources of the MOSFETs 52 and 54 are tied to the drain of a P-type MOSFET 56 which is coupled to the power supply input 14 and serves as the current source for the input pair of MOSFETs 52 and 54. The drain of the MOSFET 52 is coupled to a node 58 which is coupled to a cascode load circuit, which in this example includes an N-type cascode MOSFET 60 having a source coupled to the node 58. The drain of the MOSFET 54 is coupled to a node 62 which is coupled to a load cascode circuit, which in this example includes an N-type cascode MOSFET 64 having a source coupled to the node 62. The drain of the cascode MOSFET 60 is coupled to the positive output 22 and the drain of the cascode MOSFET 64 is coupled to the negative output 24.

The cascode load circuit includes additional P-type load MOSFETS 66, 68 and 70 are coupled in series with the cascode MOSFET 60 and an N-type load MOSFET 136 between the power supply input 14 and the low power input 16. The other cascode load circuit includes additional P-type load MOSFETS 72, 74 and 76 are wired in series with the cascode MOSFET 64 and an N-type load MOSFET 138 between the high voltage supply input 14 and the low voltage supply input 16. Thus, the difference between the input voltages from the positive input 18 and the negative input 20 are amplified via the cascode MOSFETs 60 and 64 respectively to produce the positive and negative outputs 22 and 24 respectively. Those of ordinary skill in the art will understand that the MOSFETs used in the amplifier assembly 10 may be replaced with other transistor or switch devices including for example JFETs, IGFETs and BJTs.

The enable input 34 is coupled to the gate of a P-type MOSFET 78 which is coupled to the power supply input 14. A high signal on the enable input 34 allows the enablement of the functions of the cascode amplifier 12. The bias inputs 26, 28, 30 and 32 provide bias voltages for the cascode amplifier 12. Specifically, the bias inputs 26 and 28 provide a bias voltage for the gates of the load MOSFETs 68, 70, 74 and 76. The bias input 26 is coupled to the gates of N-type MOSFETs 80 and 82. The sources of MOSFETs 80 and 82 are tied to the low power supply input 16 via N-type MOSFETs 84 and 86 respectively. The bias input 28 is also coupled to the gates of the MOSFETs 84 and 86. The drain of the MOSFET 80 is coupled to the gate and drain of a P-type MOSFET 88 which is tied to the gates of the load MOSFETs 68 and 74. The drain of the MOSFET 82 is coupled to the gate and drain of a P-type MOSFET 90 which is tied to the gates of the load MOSFETs 70 and 76. The gates of the load MOSFETs 70 and 76 are coupled via a P-type MOSFET 92 to the power supply input 14.

The positive input 18 and the negative input 20 are also tied to gates of an additional input pair of N-type MOSFETs 100 and 102 respectively. The drains of the MOSFETs 100 and 102 are coupled to the sources of load MOSFETs 68 and 74 respectively. The sources of the MOSFETs 100 and 102 are coupled to the drain of an N-type MOSFET 104 which is coupled to the low power supply input 16. The MOSFETs 100 and 102 are provided for high common mode voltage operation of the amplifier 12.

The bias input 28 is coupled to the gate of an N-type MOSFET 106 which is coupled between the low power supply input 16 and a P-type MOSFET 108 which is coupled to the power supply input 14. The source of a P-type MOSFET 110 is tied to the drain of the MOSFET 56 and provides current for the N-type MOSFETs 100 and 102 when the cascode amplifier 12 is operating in a high common voltage mode voltage. A P-type MOSFET 112 is tied to the power supply input 14 and in conjunction with MOSFETs 114, 116, 118 and 120 serve to amplify current supplied to the MOSFETs 100 and 102 when the cascode amplifier 12 is operating in a high common voltage mode.

The bias input 30 provides a bias voltage for the gates of the load MOSFETs 66 and 72 via a current mirror MOSFET 122. The bias input 30 via the current mirror MOSFET 122 also is coupled to the gate of a P-type MOSFET 124. The MOSFET 124 is coupled in series with N-type MOSFETs 126 and 128 in between the power supply input 14 and the low power supply input 16. The MOSFET 124 provides current for the MOSFETs 126 and 128. The bias input 30 also provides bias voltage for the MOSFET 56.

The bias input 32 is coupled to the gate of an N-type MOSFET 130 which is coupled between the low power supply input 16 and the sources of N-type MOSFETs 132 and 134. The bias input 32 provides a bias source for common mode feedback through the N-type MOSFETs 132 and 134. The gate of the N-type MOSFET 132 is tied to the drain of the cascode MOSFET 60 and the positive output 22. The source of the MOSFET 132 is tied to the gate of an N-type MOSFET 136 which forms a feedback loop from the positive output 22 with the source of the cascode MOSFET 60. The gate of the N-type MOSFET 134 is tied to the drain of the cascode MOSFET 64 and the negative output 24. The source of the MOSFET 134 is tied to the gate of an N-type MOSFET 138 which forms a feedback loop from the negative output 24 with the source of the cascode MOSFET 64. A resistor 140 is tied between the drains of the MOSFETs 132 and 134 and the power supply input 14 to provide electrostatic discharge protection.

In this example, the slew detector circuit 42 of the slew enhancement circuit 40 includes a pair of N-type MOSFETs 150 and 152. The drain of the MOSFET 150 is coupled to the drain and gate of a P-type MOSFET 154. The drain of the MOSFET 150 is coupled to the gate of a P-type MOSFET 156. The sources of the P-type MOSFETs 154 and 156 are tied to the power supply input 14. The drain of the MOSFET 150 is also coupled to the gate of a P-type MOSFET 158 which is coupled between the power supply input 14 and the gates of the cascode MOSFETs 60 and 64.

The drain of the MOSFET 152 is coupled to the drain and gate of a P-type MOSFET 160. The drain of the MOSFET 152 is coupled to the gate of a P-type MOSFET 162. The sources of the P-type MOSFETs 160 and 162 are tied to the power supply input 14. The drain of the MOSFET 152 is also coupled to the gate of a P-type MOSFET 164 which is coupled between the power supply input 14 and the gates of the cascode MOSFETs 60 and 64.

The node 58 is coupled to the gate of the MOSFET 150 while the node 62 is coupled to the source of the MOSFET 150. The node 62 is coupled to the gate of the MOSFET 152 while the node 58 is coupled to the source of the MOSFET 152. The voltages at nodes 58 and 62 are roughly equivalent during small signal operation of the cascode amplifier 12 and thus the MOSFETs 150 and 152 are normally off. When slewing occurs, the voltage at node 58 differs from the voltage at node 62 by a relatively large magnitude and turns on either the MOSFET 150 or 152.

A relatively large magnitude difference in voltages when the voltage at the node 58 is greater than the voltage at the node 62 (negative slewing) turns on the MOSFET 150. The drain of the MOSFET 150 is coupled to the drain gate of the MOSFETs 154 and the gate of the MOSFET 156 which are part of the current source 44 and are configured as a current amplifier. The MOSFETs 154 and 156 serve as a current mirror producing double the current through the MOSFET 150 via the MOSFET 156 in this example. The drain of the MOSFET 150 is also tied to the gate of the MOSFET 158 which amplifies the current by four times in this example. The current from the MOSFET 156 is coupled to the load MOSFETs 68 and 70 and the cascode MOSFET 60 to maximize slew rate. The amplified current from the MOSFET 158 is coupled to a bias circuit including the pair of MOSFETs 126 and 128 which serve to bias the gate voltage of the cascode MOSFETs 60 and 64 to prevent cut off of the cascode MOSFETs 60 and 64 from high voltage spikes at their sources during slewing for example.

Figure 3:
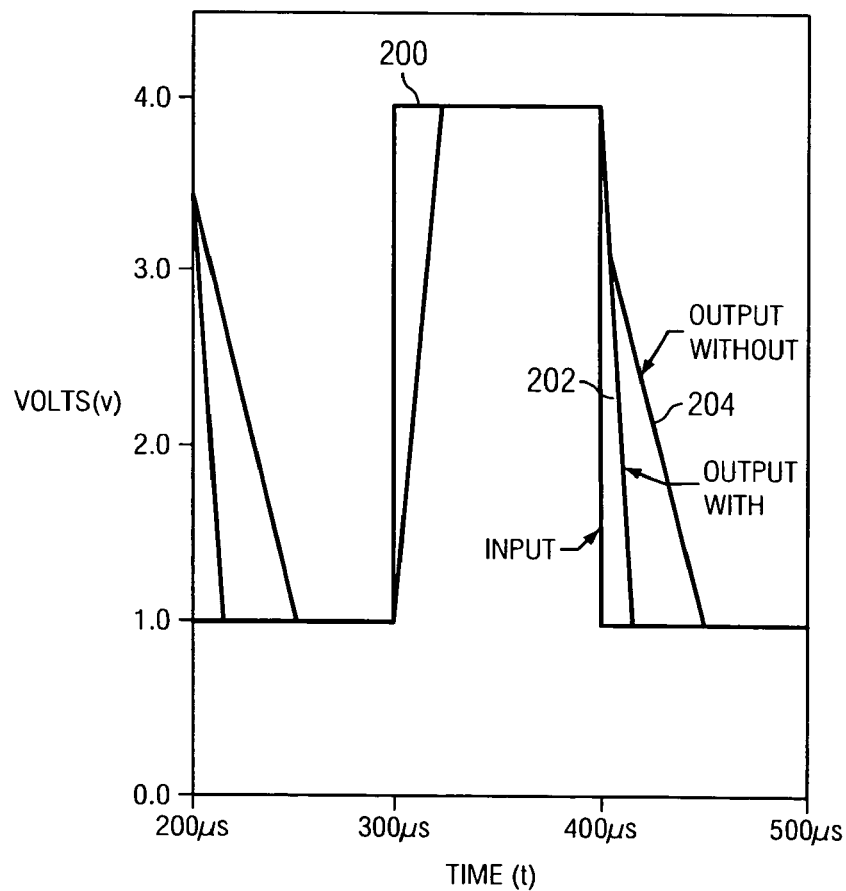
FIG. 3 is a plot of voltage versus time trace showing the stewing output of the amplifier assembly of FIG. 1 both with and without the slew enhancement circuit.
Figure 2B:
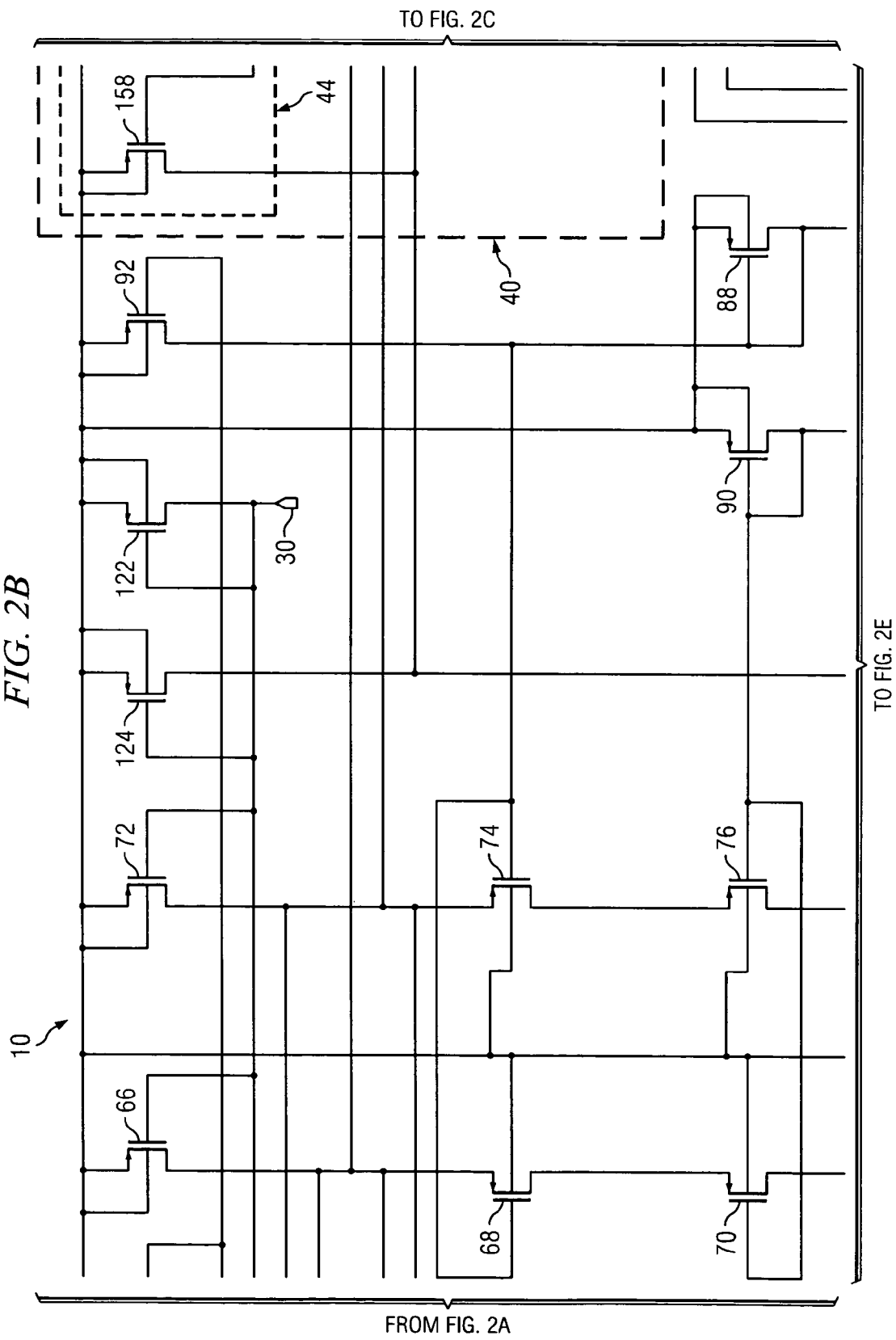
Figure 2E:
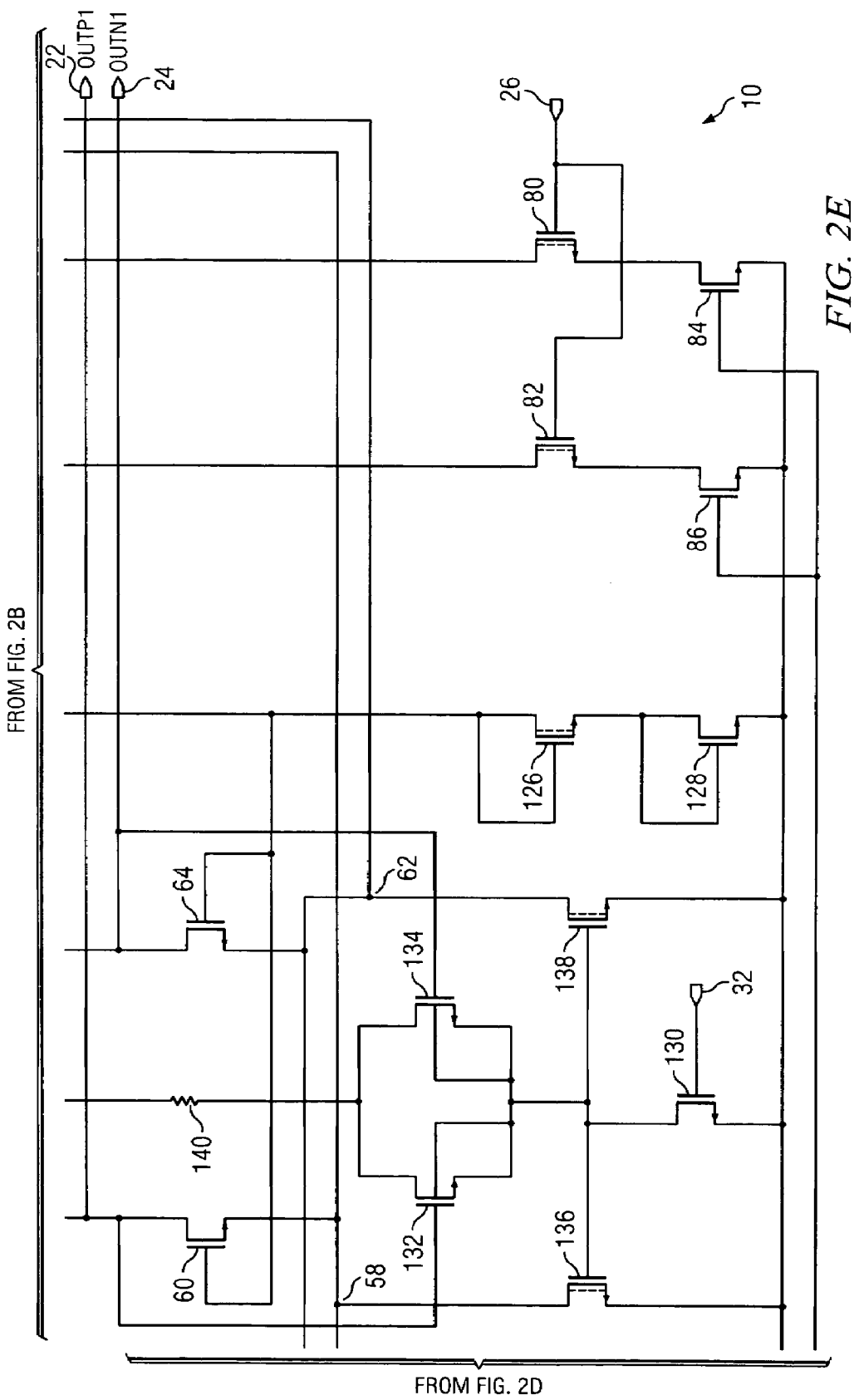

FIG. 3 is a plot of voltage versus time trace of an input signal trace 200 and an output signal trace 202 of positive and negative stewing output from the example amplifier assembly 10 placed in an example buffer circuit. The trace signal 204 of the output of the example folded cascode amplifier 12 alone is shown interposed on the output signal trace 202. The output signal 202 from the amplifier assembly 10 maximizes the slew rate in comparison to the trace signal 204 from the folded cascode amplifier 12 alone due to the extra current applied by the current mirror configuration of the MOSFETs 150, 154, 156 and 158 of the slew enhancement circuit 40 in FIGS. 2A-2E.

Returning to FIGS. 2A-2E, when a positive slewing input occurs, the voltage at the node 62 is higher than the voltage at the node 58 causing the MOSFET 152 to turn on. The drain of MOSFET 152 is coupled to the drain and gate of the MOSFET 160 and the gate of the MOSFET 164 which are part of the current source 44 and are configured as a current amplifier. The MOSFETs 160 and 162 serve as a current mirror producing double the current through the MOSFET 152 via the MOSFET 162 in this example. The drain of the MOSFET 152 is also tied to the gate of the MOSFET 164 which amplifies the current by four times in this example. The current from the MOSFET 162 is coupled to the load MOSFETs 74 and 76 and the cascode MOSFET 64 to maximize slew rate. The amplified current from the MOSFET 164 is coupled to the pair of MOSFETs 126 and 128 which serve to bias the gate voltage of the cascode MOSFETs 60 and 64 to prevent cut off of the sources of the cascode MOSFETs 60 and 64 from high voltage spikes during stewing for example.

The quiescent current of the cascode amplifier 12 may thus be reduced to a minimal level necessary to support small signal operation since the supply current is boosted by the slew enhancement circuit 40 only when a stewing input is detected on the inputs 18 and 20.

From the foregoing, persons of ordinary skill in the art will appreciate that the above disclosed methods and apparatus may be realized within a single device or across two cooperating devices, and could be implemented by software, hardware, and/or firmware to implement the slew detection and current supply circuit disclosed herein.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of providing increased current to a cascode amplifier to increase slewing rate; the amplifier having a first input coupled to an input switch and a first load circuit for amplifying a voltage on the first input, the first load circuit including a cascode transistor having a gate between the input switch and an output, and the cascode transistor having a source coupled to the input switch and a drain coupled to the output; the method comprising:
    detecting a slewing voltage input to the first input of the amplifier; and
    increasing current to the first load circuit to increase the slew rate of an output voltage.

2. A method of providing increased current to a cascode amplifier to increase slewing rate; the amplifier having a first input coupled to an input switch and a first load circuit for amplifying a voltage on the first input, and the first load circuit including a cascode transistor having a gate between the input switch and an output: the method comprising;
    detecting a slewing voltage input to the first input of the amplifier;
    increasing current to the first load circuit to increase the slew rate of an output voltage; and
    increasing the gate voltage of the cascode transistor to prevent transistor cutoff during the slewing voltage input.

3. A method of providing increased current to a cascode amplifier to increase slewing rate; the amplifier having a first input coupled to an input switch and a first load circuit for amplifying a voltage on the first input, and the amplifier having a second input coupled to a second load circuit; the method comprising:
    detecting a slewing voltage input to the first input of the amplifier, the detection of the slewing input including comparing the voltages input at the first and second load circuits; and
    increasing current to the first load circuit to increase the slew rate of an output voltage.

4. The method of claim 3 wherein the voltages input at the first and second load circuits activate a first current switch to activate a current source to increase current to the first load circuit when the voltage at the first load circuit is greater than the voltage at the second load circuit.

5. The method of claim 4 wherein the slewing input is a negative slew.

6. The method of claim 5 wherein the voltages input at the first and second load circuits activate a second current switch to increase current to a second load circuit wherein the voltages input at the first and second load circuits represent a positive slewing input.

7. The method of claim 4 wherein the first current switch and the input switch are metal oxide semiconductor field effect transistors (MOSFET).

8. The method of claim 4 wherein the current source is a pair of MOSFETs in a current mirror configuration coupled to a power supply input.

9. A cascode amplifier comprising:
    a power supply input;
    a low power supply input;
    a first load circuit coupled between the low power supply input and the power supply input, the first load circuit including a positive output;
    a second load circuit coupled between the low power input and the power supply input, the second load circuit including a negative output;
    a positive input coupled to a first input switch, the first input switch coupled between the power supply input and the first load circuit;
    a negative input coupled to a second input switch, the second input switch coupled between the power supply input and the second load circuit;
    a slew detector coupled to the first and second input switch to detect a slewed voltage input on the positive or negative input; and
    a current amplifier coupled to the first load circuit, the current amplifier sending an amplified current to the first load circuit when a slewed voltage input is detected by the slew detector.

10. The cascode amplifier of claim 9 wherein the first load circuit includes a cascode transistor having a gate.

11. The cascode amplifier of claim 10 wherein the current amplifier increases voltage on the gate of the cascode transistor to prevent transistor cutoff during slewing when a slewed voltage input is detected by the slew detector.

12. The cascode amplifier of claim 9 wherein the first and second input switches are metal oxide semiconductor field effect transistors (MOSFET).

13. The cascode amplifier of claim 9 wherein the current amplifier is coupled to the second load circuit, the current amplifier sending an amplified current to the second load circuit when a slewed voltage input is detected by the slew detector.

14. The cascode amplifier of claim 13 wherein the slew detector includes a current switch controlled by the voltage input to the first load circuit and the voltage input to the second load circuit; and wherein the current amplifier includes a current source which is connected via the current switch to provide current to the first load circuit.

15. The cascode amplifier of claim 14 where the current switch is a MOSFET having a gate coupled to a voltage input of the first load circuit and a source coupled to a voltage input of the second load circuit.

16. The cascode amplifier of claim 14 wherein the slew detector detects a negative slew when the voltage input to the first load circuit is greater than the voltage input to the second load circuit.

17. The cascode amplifier of claim 15 further comprising:
a second MOSFET current switch having a gate coupled to the voltage input of the second load circuit and a source coupled to the voltage input of the first load circuit; and
wherein the slew detector detects a positive slew by determining the voltage input to the second load circuit is greater than the voltage input to the first load circuit, and the second MOSFET current switch connects a second current source in the current amplifier to provide current to the second load circuit.

18. The cascode amplifier of claim 14 wherein the current source is a pair of MOSFETs in a current mirror configuration coupled to the power supply input.

* * * * *